(12) United States Patent
Kim et al.

(10) Patent No.: US 10,693,436 B2
(45) Date of Patent: Jun. 23, 2020

(54) IMPEDANCE ADJUSTING CIRCUIT AND INTEGRATED CIRCUIT INCLUDING THE SAME

(71) Applicants: SK hynix Inc., Gyeonggi-do (KR); Seoul National University R&DB Foundation, Seoul (KR)

(72) Inventors: Suhwan Kim, Seoul (KR); Joo-Hyung Chae, Seoul (KR); Deog-Kyoon Jeong, Seoul (KR)

(73) Assignees: SK hynix Inc., Gyeonggi-do (KR); Seoul National University R&DB Foundation, Seoul (KR)

( * ) Notice: Subject to any disclaimer, the term of this patent is extended or adjusted under 35 U.S.C. 154(b) by 236 days.

(21) Appl. No.: 15/965,545

(22) Filed: Apr. 27, 2018

(65) Prior Publication Data

US 2019/0081609 A1    Mar. 14, 2019

(30) Foreign Application Priority Data

Sep. 12, 2017  (KR) .......................... 10-2017-0116487

(51) Int. Cl.
*H03H 7/40* (2006.01)
*H03H 11/30* (2006.01)
(Continued)

(52) U.S. Cl.
CPC .............. *H03H 7/40* (2013.01); *H03H 11/30* (2013.01); *H03H 17/0045* (2013.01); *H03K 19/0005* (2013.01)

(58) Field of Classification Search
CPC ...... H03H 7/40; H03H 17/0045; H03H 11/30; H03K 19/0005
(Continued)

(56) References Cited

U.S. PATENT DOCUMENTS

2013/0335114 A1\* 12/2013 Chen .................. H03K 19/0005
326/30
2015/0340069 A1\* 11/2015 Arai ..................... G11C 29/021
326/30

(Continued)

OTHER PUBLICATIONS

Jung, H. et al., A 4.35Gb/s/pin LPDDR4 I/O Interface with Multi-VOH Level, Equalization Scheme, and Duty-Training Circuit for Mobile Applications, Symposium on VLSI Circuits Digest of Technical Papers, 2015.

(Continued)

*Primary Examiner* — Don P Le
(74) *Attorney, Agent, or Firm* — IP & T Group LLP (57) ABSTRACT

An impedance adjusting circuit includes: a first node coupled to a resistor; a first impedance unit having an impedance value determined based on a first impedance code and coupled between a first voltage terminal and a second node; a first switching unit suitable for electrically connecting the first node and the second node to each other in response to a clock; a first average voltage unit suitable for generating an average voltage of the first node; a first comparison unit suitable for comparing the average voltage of the first node with a first reference voltage to produce a comparison result of the first comparison unit; and a first code generation unit suitable for generating the first impedance code in response to the comparison result of the first comparison unit.

18 Claims, 6 Drawing Sheets

(51) Int. Cl.
*H03H 17/00* (2006.01)
*H03K 19/00* (2006.01)

(58) Field of Classification Search
USPC .......................................................... 326/30
See application file for complete search history.

(56) References Cited

U.S. PATENT DOCUMENTS

| | | | |
|---|---|---|---|
| 2016/0258997 A1* | 9/2016 | Tang | G11C 5/04 |
| 2016/0259385 A1* | 9/2016 | Tang | H03K 19/01754 |
| 2017/0154668 A1* | 6/2017 | Ha | G11C 11/4094 |
| 2017/0168746 A1* | 6/2017 | Kwon | G06F 3/0604 |
| 2018/0053567 A1* | 2/2018 | Kim | G11C 7/1057 |
| 2018/0114586 A1* | 4/2018 | Jang | G11C 29/50008 |
| 2018/0158495 A1* | 6/2018 | Jeon | G11C 7/1057 |

OTHER PUBLICATIONS

Lee, C. et al., A 6.4Gb/s/pin at Sub-1V Supply Voltage TX-interleaving Technique for Mobile DRAM Interface, Symposium on VLSI Circuits Digest of Technical Papers, 2015.
Song, Y. et al., A 0.47-0.66 pJ/bit, 4.8-8 Gb/s I/O Transceiver in 65 nm CMOS, IEEE Journal of Solid-State Circuits, pp. 1276-1289, vol. 48, No. 5, May 2013.

* cited by examiner

IMPEDANCE ADJUSTING CIRCUIT AND INTEGRATED CIRCUIT INCLUDING THE SAME

CROSS-REFERENCE TO RELATED APPLICATIONS

The present application claims priority to Korean Patent Application No. 10-2017-0116487, filed on Sep. 12, 2017, which is incorporated herein by reference in its entirety.

BACKGROUND

1. Field

Exemplary embodiments of the present invention relate to an impedance adjusting circuit.

2. Description of the Related Art

Semiconductor devices including integrated circuit chips, such as a Central Processing Unit (CPU), a memory, and a gate array, are used for a wide variety of electrical products, such as a personal computer, a server, or a workstation. In many instances, those semiconductor devices include a receiving circuit for receiving various external signals through an input pad and an output circuit for outputting internal signals to the outside through an output pad.

Recently, as the operation speed of electrical products has increased, the swing width of a signal communicated between semiconductor devices have been decreasing gradually. One reason for the decrease is to minimize the delay time that is taken for transferring a signal. However, as the swing width of a signal decreases, the influence from external noise increases, and the reflection of a signal caused by impedance mismatching at the interface becomes significant. The impedance mismatching occurs due to external noise and undesirable variation in the power source voltage, in the operation temperature, and in the fabrication process. When impedance mismatching occurs, it becomes difficult to transfer data at a high speed, and also the output data from the data output terminal of a semiconductor device may be distorted.

ZQ calibration is a process of generating an impedance code that may be different depending on the variation in PVT (Process, Voltage, and Temperature) conditions. The pull-up impedance value and the pull-down impedance value of an output driver circuit (e.g., a transferring circuit) may be controlled based on the impedance code generated as a result of the ZQ calibration. There is a need for an improved impedance adjusting circuit that can generate an impedance code and for an improved output driver circuit where the impedance value is adjusted based on the impedance code.

SUMMARY

Embodiments of the present invention are directed to a method of accurately adjusting the impedance value of an output driver.

In accordance with an embodiment of the present invention, an impedance adjusting circuit includes: a first node coupled to a resistor; a first impedance unit having an impedance value determined based on a first impedance code and coupled between a first voltage terminal and a second node; a first switching unit suitable for electrically connecting the first node and the second node to each other in response to a clock; a first average voltage unit suitable for generating an average voltage of the first node; a first comparison unit suitable for comparing the average voltage of the first node with a first reference voltage to produce a comparison result of the first comparison unit; and a first code generation unit suitable for generating the first impedance code in response to the comparison result of the first comparison unit.

The first switching unit may include: a first boot strapper suitable for level-shifting the clock to produce a level-shifted clock; and a first switch suitable for electrically connecting the first node and the second node to each other in response to the level-shifted clock.

The first average voltage unit may include a first low pass filter.

The resistor may be an external resistor coupled between the first node and a second voltage terminal, and the first voltage terminal is a power source voltage terminal, and the second voltage terminal is a ground voltage terminal.

The resistor may be coupled between the first node and a second voltage terminal, and the first voltage terminal is a ground voltage terminal, and the second voltage terminal is a power source voltage terminal.

The impedance adjusting circuit may further include: a second impedance unit having an impedance value determined based on a second impedance code and coupled between a second voltage terminal and a third node; a second switching unit suitable for electrically connecting the first node and the third node to each other in response to the clock; a second comparison unit suitable for comparing the average voltage of the first node with a second reference voltage to produce a comparison result of the second comparison unit; and a second code generation unit suitable for generating the second impedance code in response to the comparison result of the second comparison unit.

The second switching unit and the second code generation unit may be disabled in a section where the first impedance code is generated, and the first code generation unit may be disabled in a section where the second impedance code is generated.

The second switching unit may include: a second boot strapper suitable for level-shifting the clock; and a second switch suitable for electrically connecting the first node and the third node to each other in response to the level-shifted clock obtained by the second boot strapper.

The impedance adjusting circuit may further include: a second impedance unit having an impedance value determined based on the first impedance code and coupled between the first voltage terminal and a third node; a third impedance unit having an impedance value determined based on the second impedance code and coupled between the second voltage terminal and a fourth node; a second switching unit suitable for electrically connecting a fifth node and the third node to each other in response to the clock; a third switching unit suitable for electrically connecting the fifth node and the fourth node to each other in response to the clock; a second average voltage unit suitable for generating an average voltage of the fifth node; a second comparison unit suitable for comparing the average voltage of the fifth node with a second reference voltage to produce a comparison result of the second comparison unit; and a second code generation unit suitable for generating the second impedance code in response to the comparison result of the second comparison unit.

The second switching unit may include: a second boot strapper suitable for level-shifting the clock; and a second switch suitable for electrically connecting the fifth node and the third node to each other in response to the level-shifted clock obtained by the second boot strapper, and the third switching unit includes: a third boot strapper suitable for level-shifting the clock; and a third switch suitable for electrically connecting the fifth node and the fourth node to each other in response to the level-shifted clock obtained by the third boot strapper.

The second average voltage unit may include a second low pass filter.

In accordance with another embodiment of the present invention, an integrated circuit includes: a first node coupled to a resistor; a first impedance unit having an impedance value determined based on a first impedance code and coupled between a first voltage terminal and a second node; a first switching unit suitable for electrically connecting the first node and the second node to each other in response to a clock; a first average voltage unit suitable for generating an average voltage of the first node; a first comparison unit suitable for comparing the average voltage of the first node with a first reference voltage to produce a comparison result of the first comparison unit; a first code generation unit suitable for generating the first impedance code in response to the comparison result of the first comparison unit; a second impedance unit having an impedance is value determined based on a second impedance code and coupled between a second voltage terminal and a third node; a second switching unit suitable for electrically connecting the first node and the third node to each other in response to the clock; a second comparison unit suitable for comparing the average voltage of the first node with a second reference voltage to produce a comparison result of the second comparison unit; a second code generation unit suitable for generating the second impedance code in response to the comparison result of the second comparison unit; a first output driver circuit having a driving force controlled based on the first impedance code and the second impedance code to output first output data to a fourth node; a second output driver circuit having a driving force controlled based on the first impedance code and the second impedance code to output second output data to a fifth node; a third switching unit suitable for electrically connecting the fourth node and an output node to each other in response to the clock; and a fourth switching unit suitable for electrically connecting the fifth node and the output node to each other in response to an inverted clock.

The second switching unit and the second code generation unit may be disabled in a section where the first impedance code is generated, and the first code generation unit may be disabled in a section where the second impedance code is generated.

The first output driver circuit may include: a first pull-up driver that drives the fourth node with a first logic level, when the first output data is in the first logic level, and has an impedance value controlled based on the first impedance code; and a first pull-down driver that drives the fourth node with a second logic level, when the first output data is in the second logic level, and has an impedance value controlled based on the second impedance code.

The second output driver circuit may include: a second pull-up driver that drives the fifth node with the first logic level, when the second output data is in the first logic level, and has an impedance value controlled based on the first impedance code; and a second pull-down driver that drives the fifth node with the second logic level, when the second output data is in the second logic level, and has an impedance value controlled based on the second impedance code.

In accordance with yet another embodiment of the present invention, an integrated circuit includes: a first node coupled to a resistor; a first impedance unit having an impedance value determined based on a first impedance code and coupled between a first voltage terminal and a second node; a first switching unit suitable for electrically connecting the first node and the second node to each other in response to a clock; a first average voltage unit suitable for generating an average voltage of the first node; a first comparison unit suitable for comparing the average voltage of the first node with a first reference voltage to produce a comparison result of the first comparison unit; a first code generation unit suitable for generating the first impedance code in response to the comparison result of the first comparison unit; a second impedance unit having an impedance value determined based on the first impedance code and coupled between the first voltage terminal and a third node; a third impedance unit having an impedance value determined based on a second impedance code and coupled between a second voltage terminal and a fourth node; a second switching unit suitable for electrically connecting a fifth node and the third node to each other in response to the clock; a third switching unit suitable for electrically connecting the fifth node and the fourth node to each other in response to the clock; a second average voltage unit suitable for generating an average voltage of the fifth node; a second comparison unit suitable for comparing the average voltage of the fifth node with a second reference voltage to produce a comparison result of the second comparison unit; a second code generation unit suitable for generating the second impedance code in response to the comparison result of the second comparison unit; a first output driver circuit having a driving force controlled based on the first impedance code and the second impedance code to output first output data to the fourth node; a second output driver circuit having a driving force controlled based on the first impedance code and the second impedance code to output second output data to the fifth node; a fourth switching unit suitable for electrically connecting the fourth node and an output node to each other in response to the clock; and a fifth switching unit suitable for electrically connecting the fifth node and the output node to each other in response to an inverted clock.

The first output driver circuit may include: a first pull-up driver that drives the fourth node with a first logic level, when the first output data is in the first logic level, and has an impedance value controlled based on the first impedance code; and a first pull-down driver that drives the fourth node with a second logic level, when the first output data is in the second logic level, and has an impedance value controlled based on the second impedance code.

The second output driver circuit may include: a second pull-up driver that drives the fifth node with the first logic level, when the second output data is in the first logic level, and has an impedance value controlled based on the first impedance code; and a second pull-down driver that drives the fifth node with the second logic level, when the second output data is in the second logic level, and has an impedance value controlled based on the second impedance code.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The terminology used herein is for the purpose of describing particular embodiments only and is not intended to be limiting of the present invention.

As used herein, singular forms may include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

Hereinafter, the various embodiments of the present invention will be described in detail with reference to the attached drawings.

Figure 1:
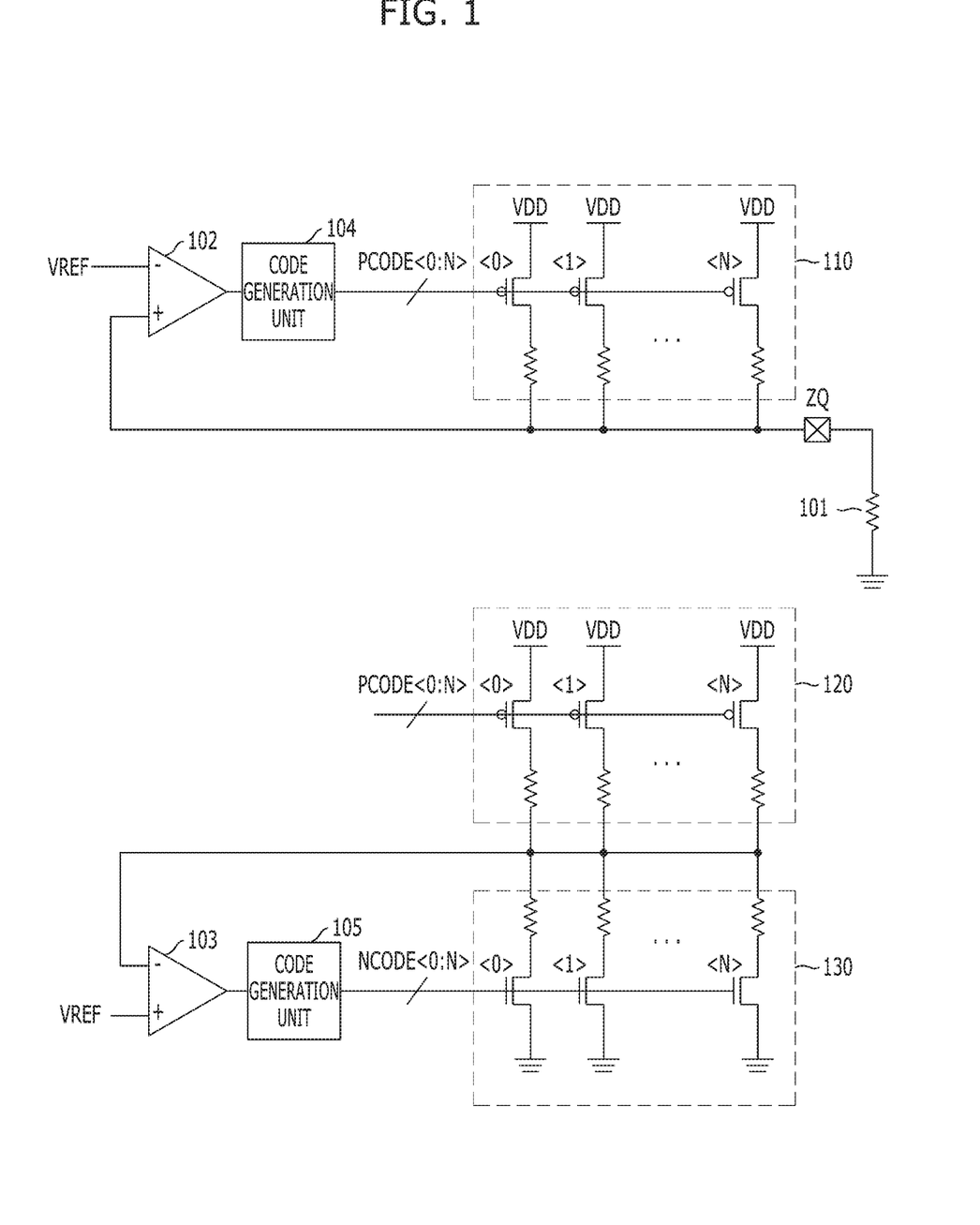
FIG. 1 is a schematic diagram of an impedance adjusting circuit.

FIG. 1 is a schematic diagram of an impedance adjusting circuit.

Referring to FIG. 1, the impedance adjusting circuit may include pull-up impedance units 110 and 120, a pull-down impedance unit 130, comparison units 102 and 103, code generation units 104 and 105.

Referring to FIG. 1, an exemplary operation of the calibration circuit is described as follows. The comparison unit 102 may compare a voltage at the calibration node ZQ, which is generated by a voltage division between the pull-up impedance unit 110 and the external resistance 101 (e.g., approximately 240Ω) coupled to a calibration pad ZQ PAD, with a reference voltage VREF (e.g., half of the power source voltage VDD so that VREF=VDD/2).

The code generation unit 104 may generate a pull-up impedance code PCODE<0:N> in response to the comparison result of the comparison unit 102. The pull-up impedance code PCODE<0:N> may be used to adjust the impedance value of the pull-up impedance unit 110 by turning on/off parallel resistors (which are designed to have impedance values according to the binary weights) in the inside of the pull-up impedance unit 110. The adjusted impedance value of the pull-up impedance unit 110 may affect the voltage of the calibration node ZQ again, and the above-described operation may be repeated. Consequently, the calibration operation (more specifically, the pull-up calibration operation) may be repeated until the total impedance value of the pull-up impedance unit 110 becomes substantially the same as the impedance value of the external resistor 101.

The pull-up impedance code PCODE<0:N> may be inputted into the pull-up impedance unit 120 and decide the impedance value of the pull-up impedance unit 120. In short, the impedance value of the pull-up impedance unit 120 may become the same as the impedance value of the pull-up impedance unit 110. A pull-down calibration operation may be performed in a similar manner to the pull-up calibration operation. That is, the pull-down calibration operation may be performed in such a manner that the voltage at node A becomes the same as the reference voltage VREF by using the comparison unit 103 and the code generation unit 105.

When the pull-up and pull-down calibration operations are completed, the pull-up impedance code PCODE<0:N> may be generated in such a manner that the external resistor 101 and the pull-up impedance unit 110 have the same impedance value, and a pull-down impedance code may be generated in such a manner that the pull-up impedance unit 120 and the pull-down impedance unit 130 have the same impedance value. Those skilled in the art will note, however, that the above-described calibration operations are exemplary embodiments of the present disclosure, and various other calibration schemes may be used. For instance, a pull-down calibration operation may be performed first to determine a pull-down impedance code, and then a pull-up calibration operation may be performed to determine a pull-up impedance code.

Figure 2:
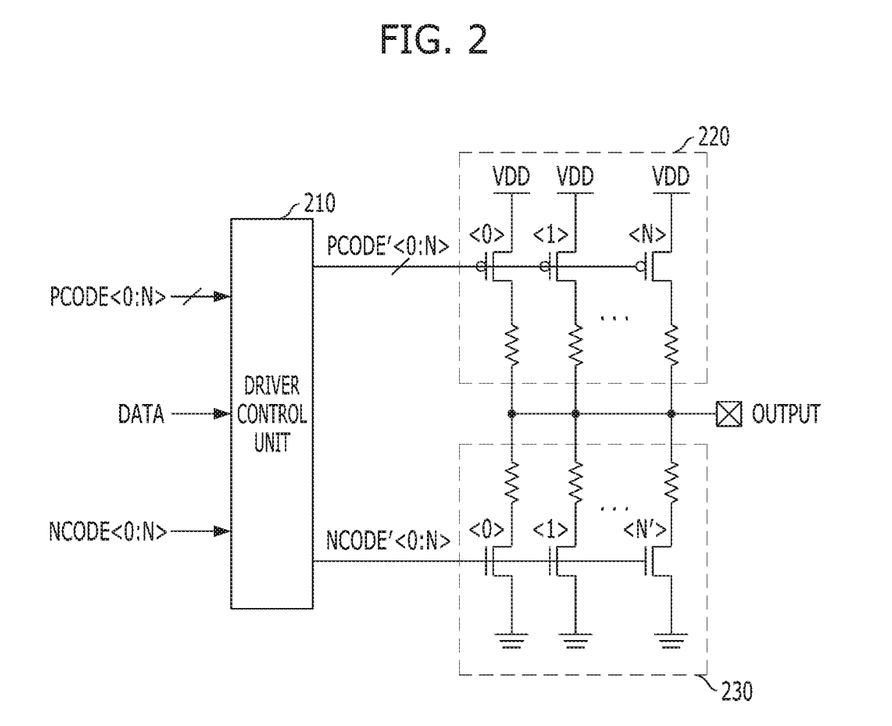
FIG. 2 is a schematic diagram of an output driver circuit.

FIG. 2 is a schematic diagram of an output driver circuit. The output driver circuit may be a transferring circuit for transferring data to the outside of an integrated circuit.

Referring to FIG. 2, the output driver circuit may include a driver control unit 210, a pull-up driver unit 220, and a pull-down driver unit 230.

The driver control unit 210 may receive data DATA, the pull-up impedance code PCODE<0:N>, and a pull-down impedance code NCODE<0:N>. The driver control unit 210 may transfer the pull-up impedance code PCODE<0:N> to the pull-up driver unit 220 when the data DATA is in a logic high level, and the pull-up driver unit 220 may output logic high data based on the impedance value that is decided based on the pull-up impedance code PCODE<0:N> through an output node OUTPUT. In short, when the data DATA is of a logic high level, a pull-up impedance code PCODE<0:N> may be the same as the pull-up impedance code PCODE<0:N> (that is, PCODE'<0:N>=PCODE<0:N>). Herein, the driver control unit 210 may turn off all the parallel resistors in the inside of the pull-down driver unit 230. In other words, when the data DATA is of a logic high level, a pull-down impedance code NCODE'<0:N> may be all in a logic low level.

When the data DATA is of a logic low level, the driver control unit 210 may transfer the pull-down impedance code NCODE<0:N> to the pull-down driver unit 230, and the pull-up driver unit 220 may output logic low data based on the impedance value that is decided based on the pull-down impedance code NCODE<0:N> through the output node OUTPUT. In short, when the data DATA is of a logic low level, a pull-down impedance code NCODE<0:N> may be the same as the pull-down impedance code NCODE<0:N> (that is, NCODE<0:N>=NCODE<0:N>). Herein, the driver control unit 210 may turn off all the parallel resistors in the inside of the pull-up driver unit 220. In other words, when the data DATA is of a logic low level, a pull-up impedance code PCODE'<0:N> may be all in a logic high level.

The pull-up driver unit 220 may be designed similarly to the pull-up impedance unit 110, and the pull-down driver unit 230 may be designed similarly to the pull-down impedance unit 130. When logic high data is outputted, the pull-up driver unit 220 may have the same impedance value (e.g., approximately 240Ω) of the pull-up impedance unit 110. The pull-up driver unit 220 may be controlled to have an impedance value, e.g., approximately 120Ω or 60Ω, by scaling. Likewise, when logic high data is outputted, the pull-down driver unit 230 may have the same impedance value (e.g., approximately 240Ω) of the pull-down impedance unit 130, and the pull-down driver unit 230 may be controlled to have an impedance value, e.g., approximately 120Ω or 60Ω, by scaling.

Figure 3:
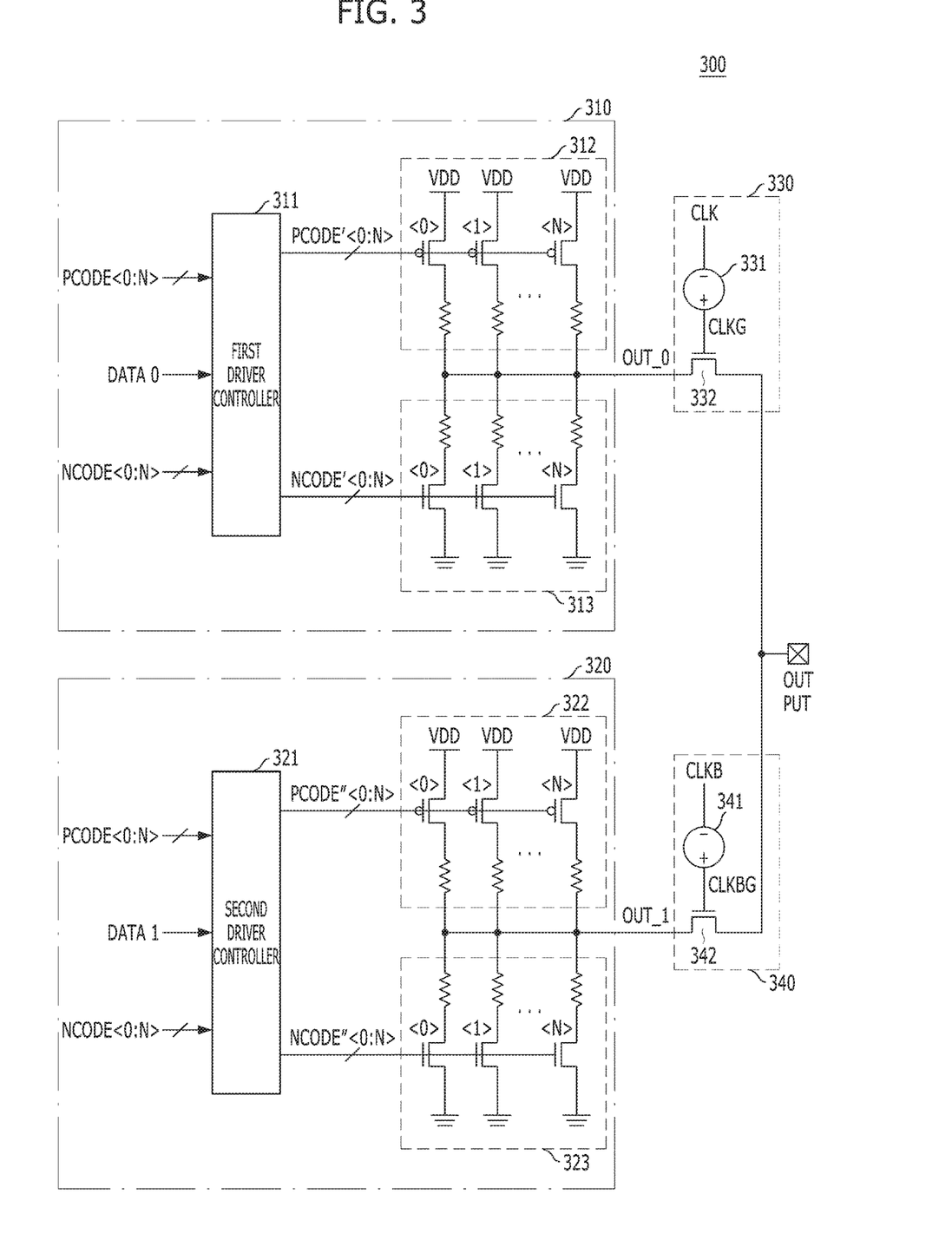
FIG. 3 is a schematic diagram illustrating a transferring circuit 300 for transferring a signal (data) in an integrated circuit in accordance with an embodiment of the present invention.

FIG. 3 is a schematic diagram illustrating a transferring circuit 300 for transferring a signal (data) in an integrated circuit in accordance with an embodiment of the present invention.

Referring to FIG. 3, the transferring circuit 300 of the integrated circuit may include a first output driver circuit 310, a second output driver circuit 320, and switching units 330 and 340.

The first output driver circuit 310 may drive a first data DATA0 to a node OUT_0. The impedance value of the first output driver circuit 310 may be adjusted based on a first impedance code PCODE<0:N> and a second impedance code NCODE<0:N>. The first output driver circuit 310 may include a first driver controller 311, a first pull-up driver 312, and a first pull-down driver 313.

The first driver controller 311 may receive the first data DATA0, the first impedance code PCODE<0:N>, and the second impedance code NCODE<0:N>. When the first data DATA0 is of a logic high level, the first driver controller 311 may transfer the first impedance code PCODE<0:N> to the first pull-up driver 312, and the first pull-up driver 312 may pull-up drive the node OUT_0 with the impedance value that is decided based on the first impedance code PCODE<0:N>. In short, when the first data DATA0 is of a logic high level, the impedance code PCODE'<0:N> may be the same as the first impedance code PCODE<0:N> (that is, PCODE'<0:N>=PCODE<0:N>). Herein, the first driver controller 311 may turn off all the parallel resistors inside of the first pull-down driver 313. In short, when the first data DATA0 is of a logic high level, the impedance code NCODE'<0:N> may be in a logic low level.

When the first data DATA0 is of a logic low level, the first driver controller 311 may transfer the second impedance code NCODE<0:N> to the first pull-down driver 313, and the first pull-down driver 313 may pull-down drive the node OUT_0 with the impedance value that is decided based on the second impedance code NCODE<0:N>. In short, when the first data DATA0 is of a logic low level, the impedance code NCODE'<0:N> may be the same as the second impedance code NCODE<0:N> (that is, NCODE'<0:N>. NCODE<0:N>). Herein, the first driver controller 311 may turn off all the parallel resistors in the inside of the first pull-up driver 312. In short, when the first data DATA0 is of a logic low level, the impedance code PCODE'<0:N> may be in a logic high level.

The second output driver circuit 320 may drive a second data DATA1 to a node OUT_1. The impedance value of the second output driver circuit 320 may be adjusted based on the first impedance code PCODE<0:N> and the second impedance code NCODE<0:N>. The second output driver circuit 320 may include a second driver controller 321, a second pull-up driver 322, and a second pull-down driver 323.

The second driver controller 321 may receive the second data DATA1, the first impedance code PCODE<0:N>, and the second impedance code NCODE<0:N>. When the second data DATA1 is of a logic high level, the second driver controller 321 may transfer the first impedance code PCODE<0:N> to the second pull-up driver 322, and the second pull-up driver 322 may pull-up drive the node OUT_1 with the impedance value that is decided based on the first impedance code PCODE<0:N>. In short, when the second data DATA1 is of a logic high level, the impedance code PCODE"<0:N> may be the same as the first impedance code PCODE<0:N> (that is, PCODE"<0:N>. PCODE<0:N>). Herein, the second driver controller 321 may turn off all the parallel resistors inside of the second pull-down driver 323. In short, when the second data DATA1 is of a logic high level, the impedance code NCODE"<0:N> may be in a logic low level.

When the second data DATA1 is of a logic low level, the second driver controller 321 may transfer the second impedance code NCODE<0:N> to the second pull-down driver 323, and the second pull-down driver 323 may pull-down drive the node OUT_1 with the impedance value that is decided based on the second impedance code NCODE<0:N>. In short, when the second data DATA1 is of a logic low level, the impedance code NCODE"<0:N> may be the same as the second impedance code NCODE<0:N> (that is, NCODE"<0:N>. NCODE<0:N>). Herein, the second driver controller 321 may turn off all the parallel resistors inside of the second pull-up driver 322. In short, when the second data DATA1 is of a logic low level, the impedance code PCODE"<0:N> may be in a logic high level.

The switching unit 330 may electrically connect the node OUT_0 to the output node OUTPUT (which is a node coupled to a pad or pin for outputting data) in response to a clock CLK. The switching unit 330 may include a boot strapper 331 and a switch 332. The boot strapper 331 may output a voltage level of the clock CLK and, more specifically, may level-shift the clock CLK to produce a level-shifted clock. For example, when the clock CLK is, e.g., approximately 0V in a logic low level, and the clock CLK is, e.g., approximately 1V in a logic high level, a clock CLKG outputted from the boot strapper 331 may be, e.g., approximately 0.2V in a logic low level, and the clock CLKG outputted from the boot strapper 331 may be, e.g., approximately 1.2V in a logic high level. The switch 332 may electrically connect the node OUT_0 to the output node OUTPUT in response to the clock CLKG outputted from the boot strapper 331. The switch 332 may be an NMOS transistor. The boot strapper 331 may be used to strongly turn on the switch 332 by raising the voltage level of the clock CLK. The boot strapper 331 may also be designed to be omitted.

The switching unit 340 may electrically connect the node OUT_1 to the output node OUTPUT in response to a clock CLKB. The switching unit 340 may include a boot strapper 341 and a switch 342. The boot strapper 341 may output a voltage level of the inverted clock CLKB. For example, when the inverted clock CLKB is, e.g., approximately 0V in a logic low level, and the inverted clock CLKB is, e.g., approximately 1V in a logic high level, an inverted clock CLKBG outputted from the boot strapper 341 may be, e.g., approximately 0.2V in a logic low level, and the inverted clock CLKBG outputted from the boot strapper 341 may be, e.g., approximately 1.2V in a logic high level. The switch 342 may electrically connect the node OUT_1 to the output node OUTPUT in response to the inverted clock CLKBG outputted from the boot strapper 341. The boot strapper 341 may also be designed to be omitted from the switching unit 340.

The switching units 330 and 340 may electrically connect the output node OUT_0 of the first output driver circuit 310 and the output node OUT_1 of the second output driver circuit 320 to the output node OUTPUT alternately. In other words, while the clock CLK is in a logic high level, the first data DATA0 may be outputted to the output node OUTPUT. While the clock CLK is in a logic low level, the second data DATA1 may be outputted to the output node OUTPUT.

When the transferring circuit 300 has the structure as shown in FIG. 3, the impedance adjusting circuit for generating the impedance codes PCODE<0:N> and NCODE<0:N> for adjusting the impedance values of the first and second output driver circuits 310 and 320 of the transferring circuit 300 may have to have a different structure from one embodiment shown in FIG. 1, which is described below in detail.

Figure 4:
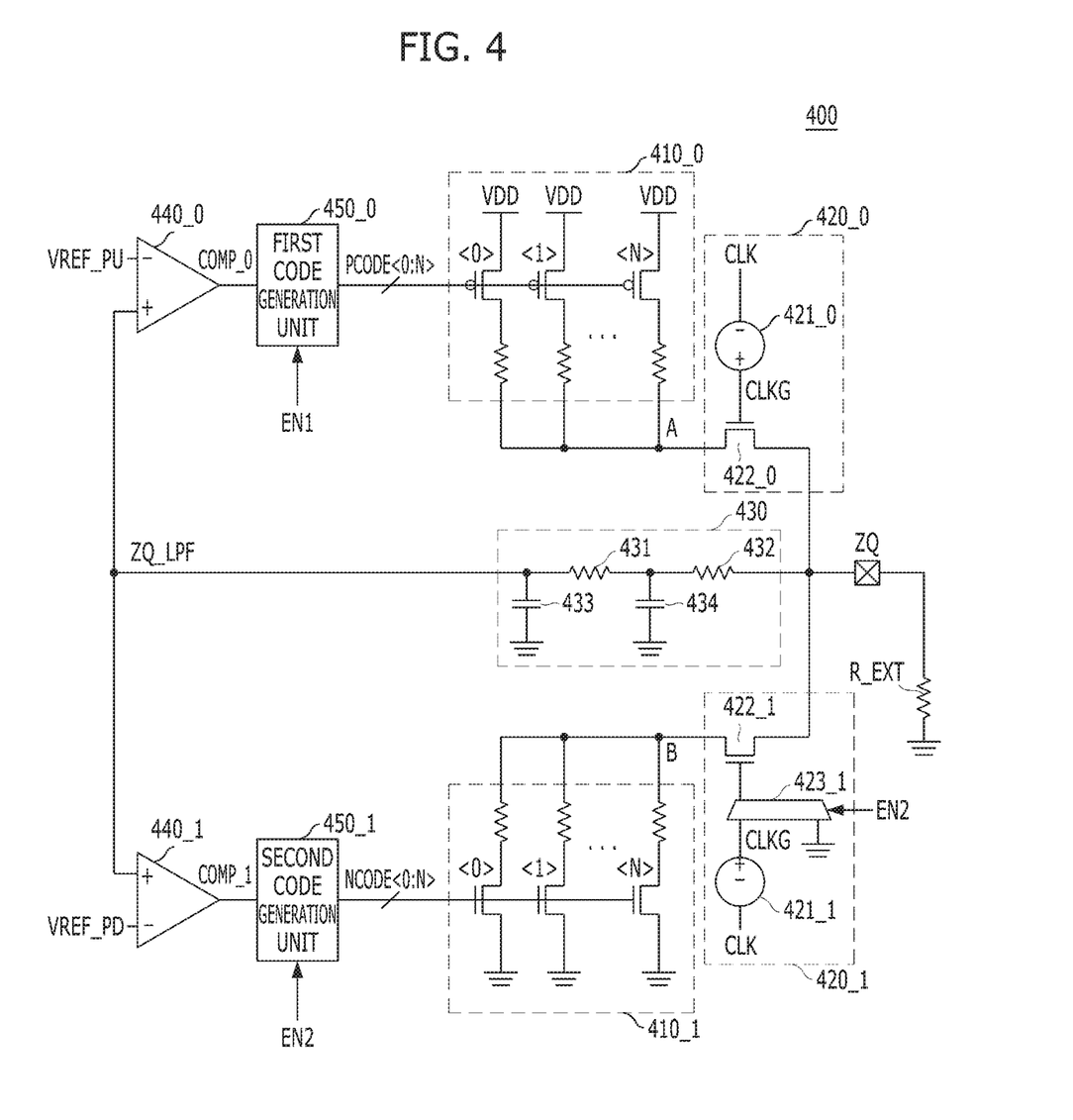
FIG. 4 is a schematic diagram illustrating an impedance adjusting circuit in accordance with an embodiment of the present invention.

FIG. 4 is a schematic diagram illustrating an impedance adjusting circuit 400 in accordance with an embodiment of the present invention. The impedance adjusting circuit 400 and the transferring circuit 300 may be included in the same integrated circuit, e.g., a processor, a memory, and the like, and the impedance codes PCODE<0:N> and NCODE<0:N> generated in the impedance adjusting circuit 400 may be used to adjust the impedance value of the transferring circuit 300.

Referring to FIG. 4, the impedance adjusting circuit 400 may include a node ZQ coupled to an external resistor R_EXT, a first impedance unit 410_0, a first switching unit 420_0, an average voltage unit 430, a first comparison unit 440_0, a first code generation unit 450_0, a second impedance unit 410_1, a second switching unit 420_1, a second comparison unit 440_1, and a second code generation unit 450_1.

The external resistor R_EXT may be coupled to the node ZQ. The external resistor R_EXT may exist in the outside of an integrated circuit, and the external resistor R_EXT may be coupled to a pad which is formed at the node ZQ. The external resistor R_EXT may have a certain amount of resistance value. The external resistor R_EXT may generally have a resistance value of approximately 240Ω, for example.

The first impedance unit 410_0 may have an impedance value that is decided based on the first impedance code PCODE<0:N> and drive node A with the first level VDD. The first impedance unit 410_0 may include a plurality of transistors that are turned on/off based on the first impedance code PCODE<0:N> and a plurality of resistors that are respectively coupled to the transistors.

The first switching unit 420_0 may electrically connect the node A to the node ZQ in response to the clock CLK. The first switching unit 420_0 may include a first boot strapper 421_0 and a first switch 422_0. The first boot strapper 421_0 may increase the voltage level of the clock CLK and output the clock CLK of the increased voltage level. For example, when the clock CLK is, e.g., approximately 0V in a logic low level, and the clock CLK is, e.g., approximately 1V in a logic high level, a clock CLKG outputted from the first boot strapper 421_0 may be, e.g., approximately 0.2V in a logic low level, and the clock CLKG outputted from the first boot strapper 421_0 may be, e.g., approximately 1.2V in a logic high level. The first switch 422_0 may electrically connect the node A to the node ZQ in response to the clock CLKG outputted from the first boot strapper 421_0. The first switch 422_0 may be an NMOS transistor. When the boot strapper 331 is omitted from the switching unit 330, the first boot strapper 421_0 may also be designed to be omitted from the first switching unit 420_0.

The average voltage unit 430 may generate an average voltage ZQ_LPF of the node ZQ. As the voltage of the node ZQ may vary according to whether the first switch 422_0 of the first switching unit 4200 is turned on or off and whether the second switch 4221 of the second switching unit 420_1 is turned on or off, the average voltage unit 430 may generate an average voltage ZQ_LPF of the node ZQ. For example, when the voltage of the node ZQ is changed from approximately 0V to approximately 0.7V, the average voltage ZQ_LPF generated in the average voltage unit 430 may be approximately 0.35V. The average voltage unit 430 may be a low pass filter that includes resistors 431 and 432 and capacitors 433 and 434 according to one exemplary embodiment of the present disclosure.

The first comparison unit 440_0 may compare the level of the average voltage ZQ_LPF with the level of the first reference voltage VREF_PU and generate the first comparison result COMP_0.

The first code generation unit 450_0 may increase or decrease the code value of the first impedance code PCODE<0:N> in response to the first comparison result COMP_0. In accordance with one exemplary embodiment of the present disclosure, when the first comparison result COMP_0 represents that the average voltage ZQ_LPF is higher than the first reference voltage VREF_PU, the first code generation unit 450_0 may control the code value of the first impedance code PCODE<0:N> to increase the impedance value of the first impedance unit 410_0, that is, to decrease the average voltage ZQ_LPF. Also, when the first comparison result COMP_0 represents that the first reference voltage VREF_PU is higher than the average voltage ZQ_LPF, the first code generation unit 450_0 may control the code value of the first impedance code PCODE<0:N> to decrease the impedance value of the first impedance unit 410_0, that is, to increase the average voltage ZQ_LPF. The first code generation unit 450_0 may be enabled/disabled in response to the first enable signal EN1. The first enable signal EN1 may be a signal that is enabled while the first impedance code PCODE<0:N> is generated. When the first code generation unit 450_0 is disabled, the first code generation unit 450_0 may fix the value of the first impedance code PCODE<0:N>. In short, the value of the first impedance code PCODE<0:N> right before or at the moment that the first code generation unit 450_0 is disabled may be maintained as it is while the first code generation unit 450_0 is disabled.

The second impedance unit 410_1 may have an impedance value that is decided based on the second impedance code NCODE<0:N> and drive node B with the second level, i.e., the ground voltage. The second impedance unit 410_1 may include a plurality of transistors that are turned on/off based on the second impedance code NCODE<0:N> and a plurality of resistors that are respectively coupled to the transistors.

The second switching unit 420_1 may electrically connect the node B to the node ZQ in response to the clock CLK. The second switching unit 420_1 may include a second boot strapper 421_1, a second switch 422_1, and a selector 423_1. The second boot strapper 421_1 may increase the voltage level of the clock CLK and output the clock CLK of the increased voltage level. For example, when the clock CLK is, e.g., approximately 0V in a logic low level, and the clock CLK is, e.g., approximately 1V in a logic high level, a clock CLKG outputted from the second boot strapper 421_1 may be, e.g., approximately 0.2V in a logic low level, and the clock CLKG outputted from the second boot strapper 421_1 may be, e.g., approximately 1.2V in a logic high level. The selector 423_1 may transfer the clock CLKG outputted from the second boot strapper 421_1 to the second switch 422_1 while the second enable signal EN2 is enabled, and while the second enable signal EN2 is disabled, transfer the ground voltage to the second switch 422_1. Herein, the second enable signal EN2 may be a signal that is enabled in the section that the second impedance code NCODE<0:N> is generated. The second switch 422_1 may electrically connect the node B to the node ZQ in response to the voltage that is selected by the selector 423_1. The second switch 422_1 may be an NMOS transistor. While the second enable signal EN2 is enabled, the second switch 422_1 may be turned on/off based on the clock CLKG, and while the second enable signal EN2 is disabled, the second switch 422_1 may be maintained to be turned off.

The second comparison unit 440_1 may compare the level of the average voltage ZQ_LPF with the level of a second reference voltage VREF_PD and generate a second comparison result COMP_1.

The second code generation unit 450_1 may increase or decrease the code value of the second impedance code NCODE<0:N> in response to the second comparison result COMP_1. In accordance with one exemplary embodiment of the present disclosure, when the second comparison result COMP_1 represents that the average voltage ZQ_LPF is higher than the second reference voltage VREF_PD, the second code generation unit 450_1 may control the code value of the second impedance code NCODE<0:N> to decrease the impedance value of the second impedance unit 410_1, that is, to decrease the average voltage ZQ_LPF. Also, when the second comparison result COMP_1 represents that the second reference voltage VREF_PD is higher than the average voltage ZQ_LPF, the second code generation unit 450_1 may control the code value of the second impedance code NCODE<0:N> to increase the impedance value of the second impedance unit 410_1, that is, to increase the average voltage ZQ_LPF. The second code generation unit 450_1 may be enabled/disabled in response to a second enable signal EN2. When the second code generation unit 450_1 is disabled, the second code generation unit 450_1 may fix the value of the second impedance code NCODE<0:N>. In short, the value of the second impedance code NCODE<0:N> right before or at the moment that the second code generation unit 450_1 is disabled may be maintained as it is while the second code generation unit 450_1 is disabled.

Hereafter, a process of generating the first impedance code PCODE<0:N> and the second impedance code NCODE<0:N> in the impedance adjusting circuit 400 shown in FIG. 4 is described according to one exemplary embodiment of the present disclosure.

A Process of Generating First Impedance Code PCODE<0:N>

In the section where the first impedance code PCODE<0:N> is generated, the first enable signal EN1 may be enabled, and the second enable signal EN2 may be disabled. Since the second enable signal EN2 is disabled, the second code generation unit 450_1 may be disabled, and the second switch 422_1 may be maintained to be turned off. The first enable signal EN1 may be enabled for enough time that the first impedance code PCODE<0:N> can reach its target value.

When the first switch 422_0 is turned on, the node ZQ may have a voltage level of VDD*REXT/RPU+REXT. When the first switch is 422_0 is turned off, the node ZQ may have, e.g., a voltage level of '0'. Therefore, the average voltage ZQ_LPF may have a voltage level of (VDD*REXT/(RPU+REXT))/2. Herein, "REXT" may mean the impedance value of the external resistor R_EXT, and "RPU" may mean the impedance value of the first impedance unit 410_0.

The level of the first reference voltage VREF_PU may be set to a value of (VDD*REXT/(T_RPU+REXT))/2. Herein, "T_RPU" may represent the target impedance value of the first impedance unit 410_0. Since the target impedance value of the first impedance unit 410_0 is generally the same as the "REXT", the level of the first reference voltage VREF_PU may be set to a value of VDD/4.

The first code generation unit 450_0 may increase or decrease the code value of the first impedance code PCODE<0:N> so that the average voltage ZQ_LPF becomes the same as the first reference voltage VREF_PU (e.g., so that the impedance value of the first impedance unit 410_0 becomes the same as "REXT"). As the operation is performed repeatedly, the first impedance code PCODE<0:N> may be generated to have a code value that allows the first impedance unit 410_0 to have an impedance value which is substantially the same as or close to the external resistor R_EXT.

A Process of Generating Second Impedance Code NCODE<0:N>

In accordance with one exemplary embodiment of the present disclosure, the process of generating the second impedance code NCODE<0:N> may be performed after the first impedance code PCODE<0:N> is generated. In the section where the second impedance code NCODE<0:N> is generated, the first enable signal EN1 may be disabled, and the second enable signal EN2 may be enabled. Since the first enable signal EN1 is disabled after the first impedance code PCODE<0:N> is generated, the value of the first impedance code PCODE<0:N> may be fixed, and the process of generating the second impedance code NCODE<0:N> may be performed, while the impedance value of the first impedance unit 410_0 is fixed to the same impedance value as that of the external resistor R_EXT, which is the "REXT".

When the first switch 422_0 and the second switch 422_1 are turned on, the node ZQ may have a voltage level of VDD*(REX∥REXT)/(REXT+(RPD∥REXT)). When the first switch 422_0 and the second switch 422_1 are turned off, the node ZQ may have a voltage level of '0'. Therefore, the average voltage ZQ_LPF may have a voltage level of (VDD*(REXT∥REXT)/(REXT+(RPD∥REXT)))/2. Herein, it is assumed that "RPD" is the impedance value of the second impedance unit 410_1, and the first impedance unit 410_0 has the impedance value of the "REXT".

The level of the second reference voltage VREF_PD may be set to a value of (VDD*(REXT∥REXT)/(REXT+(T_RPD∥REXT)))/2. Herein, "T_RPD" may represent the target impedance value of the second impedance unit 410_1. Since the target impedance value is T_RPD of the second impedance unit 410_1 is generally the same as the "REXT", the level of the second reference voltage VREF_PD may be set to a value of VDD/6 after all.

The second code generation unit 450_1 may increase or decrease the code value of the second impedance code NCODE<0:N> so that the average voltage ZQ_LPF becomes the same as the second reference voltage VREF_PD, that is, the impedance value of the second impedance unit 410_1 becomes the same as "REXT". As the operation is performed repeatedly, the second impedance code NCODE<0:N> may be generated to have a code value that allows the second impedance unit 410_1 to have an impedance value which is almost the same as the external resistor REXT.

In accordance with one embodiment shown in FIG. 4, the variables may correspond to exemplary values as follows: the first level is the level of the power source voltage VDD; the second level is the level of the ground voltage; the first impedance code PCODE<0:N> is a pull-up impedance code PCODE<0:N>; and the second impedance code NCODE<0:N> is a pull-down impedance code NCODE<0:N>. On the other hand, in accordance with one exemplary embodiment in which the external resistor R_EXT is coupled to the node ZQ as a pull-up resistor, the first level is the level of the ground voltage; the second level is the level of the power source voltage VDD; the first impedance code PCODE<0:N> is a pull-down impedance code NCODE<0:N>; and the second impedance code NCODE<0:N> is a pull-up impedance code PCODE<0:N>.

Figure 5:
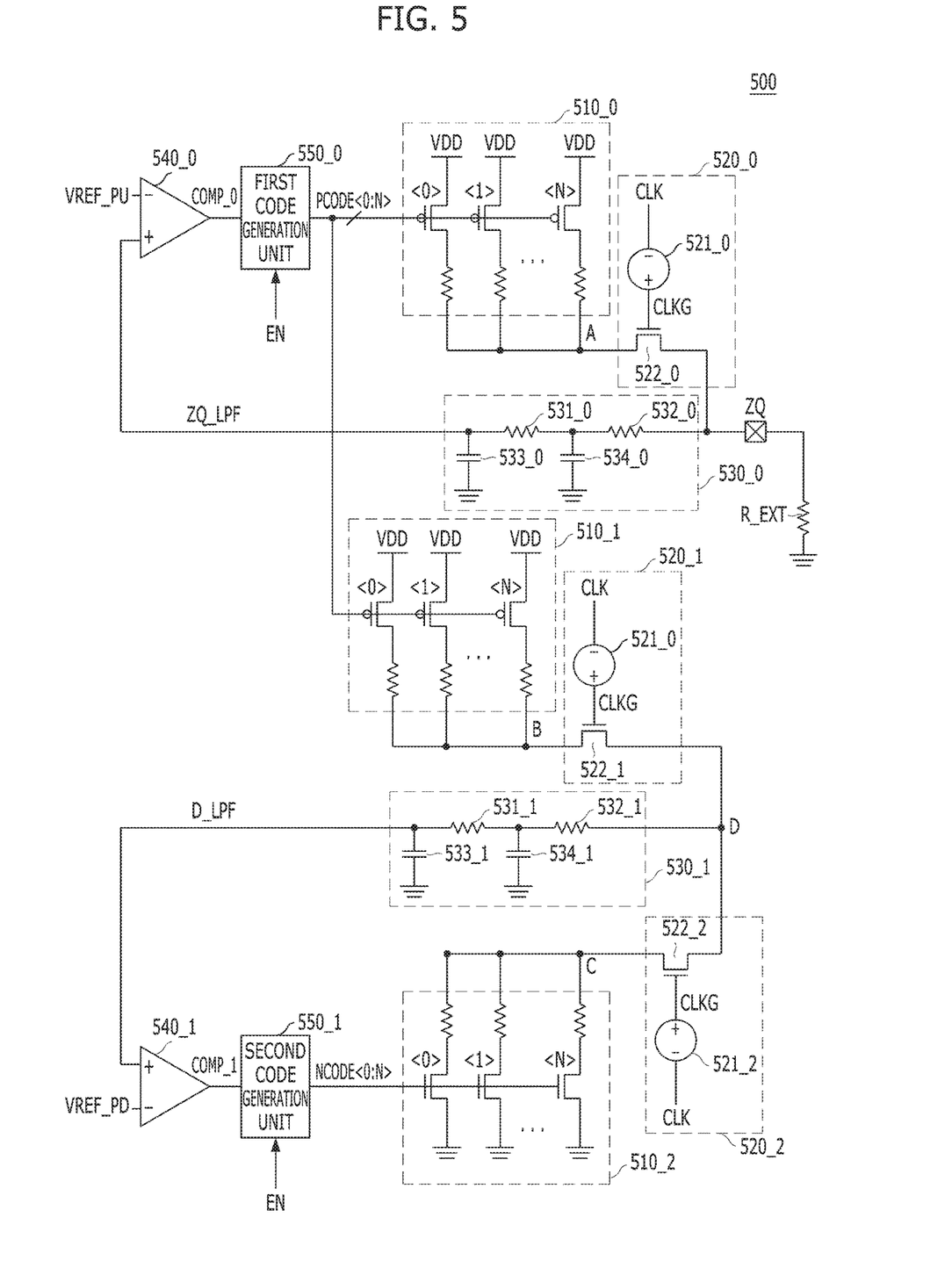
FIG. 5 is a schematic diagram illustrating an impedance adjusting circuit in accordance with an embodiment of the present invention.

FIG. 5 is a schematic diagram illustrating an impedance adjusting circuit 500 in accordance with one embodiment of the present invention. The impedance adjusting circuit 500 and the transferring circuit 300 may be included in the same integrated circuit, and the impedance codes PCODE<0:N> and NCODE<0:N> generated in the impedance adjusting circuit 500 may be used to adjust the impedance value of the transferring circuit 300. Although the second impedance code NCODE<0:N> may be generated after the first impedance code PCODE<0:N> is generated in the impedance adjusting circuit 400 shown in FIG. 4, one skilled in the art will readily appreciate that the first impedance code PCODE<0:N> and the second impedance code NCODE<0:N> may be generated concurrently or at various different times in the impedance adjusting circuit 500 shown in FIG. 5.

Referring to FIG. 5, the impedance adjusting circuit 500 may include node ZQ coupled to the external resistor R_EXT, a first impedance unit 510_0, a first switching unit 520_0, a first average voltage unit 530_0, a first comparison unit 540_0, a first code generation unit 550_0, a second impedance unit 510_1, a second switching unit 520_1, a third impedance unit 510_2, a third switching unit 520_2, a second average voltage unit 530_1, a second comparison unit 540_1, and a second code generation unit 550_1.

The node ZQ may be coupled to the external resistor R_EXT. The external resistor R_EXT may exist in the outside of the integrated circuit and may be coupled to a pad formed in the node ZQ. The external resistor R_EXT may have a set resistance value. The external resistor R_EXT may have a resistance value of approximately 240Ω, for example.

The first impedance unit 510_0 may have an impedance value that is decided based on the first impedance code PCODE<0:N> and drive a node A with the first level VDD. The first impedance unit 510_0 may include a plurality of transistors that are turned on/off based on the first impedance code PCODE<0:N> and a plurality of resistors that are respectively coupled to the transistors.

The first switching unit 520_0 may electrically connect the node A to the node ZQ in response to the clock CLK. The first switching unit 520_0 may include the first boot strapper 521_0 and the first switch 522_0. The first boot strapper 521_0 may increase the voltage level of the clock CLK and output the clock CLK of the increased voltage level. For example, when the clock CLK is, e.g., approximately 0V in a logic low level, and the clock CLK is, e.g., approximately 1V in a logic high level, a clock CLKG outputted from the first boot strapper 521_0 may be, e.g., approximately 0.2V in a logic low level, and the clock CLKG outputted from the first boot strapper 521_0 may be, e.g., approximately 1.2V in a logic high level. The first switch 522_0 may electrically connect the node A to the node ZQ in response to the clock CLKG outputted from the first boot strapper 521_0. The first switch 522_0 may be an NMOS transistor. When the boot strapper 331 is omitted from the switching unit 330, the first boot strapper 521_0 may also be designed to be omitted from the first switching unit 520_0.

The first average voltage unit 530_0 may generate an average voltage ZQ_LPF of the node ZQ. As the voltage of the node ZQ may vary according to whether the first switch 522_0 of the first switching unit 520_0 is turned on or off, the first average voltage unit 530_0 may generate an average voltage ZQ_LPF of the node ZQ. For example, when the voltage of the node ZQ is changed, e.g., from approximately 0V to approximately 0.7V, the average voltage ZQ_LPF generated in the first average voltage unit 530_0 may be, e.g., approximately 0.35V. The first average voltage unit 530_0 may be a low pass filter that includes resistors 531_0 and 532_0 and capacitors 533_0 and 534_0 according to one exemplary embodiment of the present disclosure.

The first comparison unit 540_0 may compare the level of the average voltage ZQ_LPF with the level of the first reference voltage VREF_PU and generate the first comparison result COMP_0.

The first code generation unit 550_0 may increase or decrease the code value of the first impedance code PCODE<0:N> in response to the first comparison result COMP_0. In accordance with one exemplary embodiment of the present disclosure, when the first comparison result COMP_0 represents that the average voltage ZQ_LPF is higher than the first reference voltage VREF_PU, the first code generation unit 550_0 may control the code value of the first impedance code PCODE<0:N> to increase the impedance value of the first impedance unit 510_0, that is, to decrease the average voltage ZQ_LPF. Also, when the first comparison result COMP_0 represents that the first reference voltage VREF_PU is higher than the average voltage ZQ_LPF, the first code generation unit 550_0 may control the code value of the first impedance code PCODE<0:N> to decrease the impedance value of the first impedance unit 510_0, that is, to increase the average voltage ZQ_LPF. The first code generation unit 550_0 may be enabled/disabled in response to an enable signal EN. The enable signal EN may be a signal that is enabled while the first impedance code PCODE<0:N> and the second impedance code NCODE<0:N> are generated. When the first code generation unit 550_0 is disabled, the first code generation unit 550_0 may fix the value of the first impedance code PCODE<0:N>. In short, the value of the first impedance code PCODE<0:N> right before or at the moment that the first code generation unit 450_0 is disabled may be maintained as it is while the first code generation unit 550_0 is disabled.

The second impedance unit 410_1 may have an impedance value that is decided based on the second impedance code NCODE<0:N> and drive a node B with the second level, e.g., the ground voltage. The second impedance unit 410_1 may include a is plurality of transistors that are turned on/off based on the second impedance code NCODE<0:N> and a plurality of resistors that are respectively coupled to the transistors.

The second impedance unit 510_1 may have an impedance value that is decided based on the first impedance code PCODE<0:N> and drive a node B with the first level VDD. The second impedance unit 510_1 may have the same structure as that of the first impedance unit 510_0, except that the first impedance unit 510_0 is coupled to the node B instead of the node A.

The second switching unit 520_1 may electrically connect the node B to a node D in response to the clock CLK. The second switching unit 520_1 may have the same configuration as that of the first switching unit 520_0, except that the second switching unit 520_1 electrically connects the node B to the node D.

The third impedance unit 510_2 may have an impedance value that is decided based on the second impedance code NCODE<0:N> and drive a node C with the second level, i.e., the ground voltage. The third impedance unit 510_2 may include a plurality of transistors that are turned on/off based on the second impedance code NCODE<0:N> and a plurality of resistors that are respectively coupled to the transistors.

The third switching unit 520_2 may electrically connect the node C to the node D in response to the clock CLK. The third impedance unit 510_2 may have the same structure as those of the first switching unit 520_0 and the third switching unit 520_1, except that the third switching unit 520_2 electrically connects the node C to the node D.

The second average voltage unit 530_1 may generate an average voltage D_LPF of the node D. The second average voltage unit 530_1 may be a low pass filter that includes resistors 531_1 and 532_1 and capacitors 533_1 and 534_1 according to one exemplary embodiment of the present disclosure.

The second comparison unit 540_1 may compare the level of the average voltage D_LPF with the level of the second reference voltage VREF_PD and generate the second comparison result COMP_1.

The second code generation unit 550_1 may increase or decrease the code value of the second impedance code NCODE<0:N> in response to the second comparison result COMP_1. When the second comparison result COMP_1 represents that the average voltage D_LPF is higher than the second reference voltage VREF_PD, the second code generation unit 550_1 may control the code value of the second impedance code NCODE<0:N> to decrease the impedance value of the third impedance unit 510_2, that is, to decrease the average voltage D_LPF. Also, when the second comparison result COMP_1 represents that the second reference voltage VREF_PD is higher than the average voltage D_LPF, the second code generation unit 550_1 may control the code value of the second impedance code NCODE<0:N> to increase the impedance value of the third impedance unit 510_2, that is, to increase the average voltage ZQ_LPF. The second code generation unit 550_1 may be enabled/disabled in response to an enable signal EN, as described with respect to the first code generation unit 550_0.

Hereafter, a process of generating the first impedance code PCODE<0:N> and the second impedance code NCODE<0:N> in the impedance adjusting circuit 500 shown in FIG. 5 is described according to one exemplary embodiment of the present disclosure.

A Process of Generating First Impedance Code PCODE<0:N>

In the section where the first impedance code PCODE<0:N> and the second impedance code NCODE<0:N> are generated, the enable signal EN may be enabled. The enable signal EN may be enabled for an enough time that the first impedance code PCODE<0:N> and the second impedance code NCODE<0:N> can reach its target value.

The level of the first reference voltage VREF_PU may be set to a value of VDD/4, for example, as shown in FIG. 4. The generation of the first impedance code PCODE<0:N> in the impedance adjusting circuit 500 shown in FIG. 5 may be performed in the same manner that the first impedance code PCODE<0:N> is generated in the impedance adjusting circuit 400 shown in FIG. 4.

A Process of Generating Second Impedance Code NCODE<0:N>

The generation of the second impedance code NCODE<0:N> and the generation of the first impedance code PCODE<0:N> may be performed concurrently. In other words, the generation of the first impedance code PCODE<0:N> and the generation of the second impedance code NCODE<0:N> may be concurrently performed in the section where the enable signal EN is enabled.

When the second switch 522_1 and the third switch 522_2 are turned on, the node D may have a voltage level of VDD*RPD/(RPD+RPU). When the second switch 522_1 and the third switch 522_2 are turned off, the second average voltage unit 530_1 may maintain the voltage level of the node D at the previous value. Therefore, the average voltage D_LPF may have a voltage level of VDD*RPD/(RPD+RPU).

The level of the second reference voltage VREF_PD may be set to a value of VDD/2. The second code generation unit 550_1 may adjust the value of the second impedance code NCODE<0:N> so that the average voltage D_LPF has the voltage level of VDD/2D, which is the same as the second reference voltage VREF_PD. In order for the average voltage D_LPF to have the voltage level of VDD/2D, the impedance value of the second impedance unit 510_1 and the third impedance unit 510_2 may have to have the same impedance value. Since the second impedance unit 510_1 is controlled to have the same impedance value as that of the external resistor R_EXT based on the first impedance code PCODE<0:N>, the third impedance unit is 510_2 may be controlled to have the same impedance value as that of the external resistor R_EXT. In short, the second impedance code NCODE<0:N> may be generated to have a code value that allows the third impedance unit 510_2 to have the same impedance value as that of the external resistor R_EXT.

Figure 6:
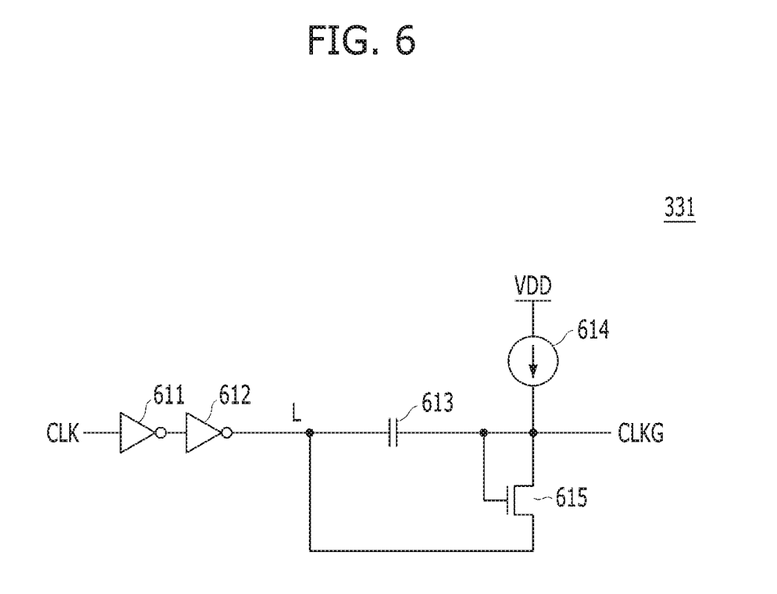
FIG. 6 is a schematic diagram illustrating a boot strapper shown in FIG. 3.

FIG. 6 is a schematic diagram illustrating the boot strapper 331 shown in FIG. 3. The boot strappers 421_0, 421_1, 521_0, 521_1, 521_2 shown in FIGS. 4 and 5 may be designed the same as those shown in FIG. 6.

Referring to FIG. 6, the boot strapper 331 may include inverters 611 and 612, a capacitor 613, a current source 614, and an NMOS transistor 615.

When a dock CLK is in a logic low level (e.g., the ground voltage level), the voltage level of a node L may be in a logic low level (e.g., the ground voltage level). An output clock CLKG of the boot strapper 331 may have a higher voltage level than the clock CLK due to the current source 614 that supplies micro-current to flow. In short, the clock CLKG may have a higher voltage level than the ground voltage level.

When a clock CLK is in a logic high level (e.g., the power source voltage VDD), the voltage level of the node L may be in a logic high level (e.g., the power source voltage VDD). The voltage level of the clock CLKG may be higher than the power source voltage VDD due to the capacitor 613, and since the NMOS transistor 615 is turned on, and the high voltage level of the clock is fed back to the node L, the voltage level of the clock may be increased higher due to the capacitor. In short, the clock may have a higher voltage level than the power source voltage.

In other words, while the clock toggles from approximately 0 Volt to VDD, the clock may toggle from approximately 0+a Volt to VDD+a.

According to various embodiments of the present invention, the impedance value of an output driver may be accurately adjusted.

While the present invention has been described with respect to the specific embodiments, it will be apparent to those skilled in the art that various changes and modifications may be made without departing from the spirit and scope of the invention as defined in the following claims.

What is claimed is:

1. An impedance adjusting circuit, comprising:
   a first node coupled to a resistor;
   a first impedance unit having an impedance value determined based on a first impedance code and coupled between a first voltage terminal and a second node;
   a first switching unit suitable for electrically connecting the first node and the second node to each other in response to a clock;
   a first average voltage unit suitable for generating an average voltage of the first node;
   a first comparison unit suitable for comparing the average voltage of the first node with a first reference voltage to produce a comparison result of the first comparison unit; and
   a first code generation unit suitable for generating the first impedance code in response to the comparison result of the first comparison unit.

2. The impedance adjusting circuit of claim 1, wherein the first switching unit includes:
   a first boot strapper suitable for level-shifting the clock to produce a level-shifted clock; and
   a first switch suitable for electrically connecting the first node and the second node to each other in response to the level-shifted clock.

3. The impedance adjusting circuit of claim 1, wherein the first average voltage unit includes a first low pass filter.

4. The impedance adjusting circuit of claim 1, wherein the resistor is an external resistor coupled between the first node and a second voltage terminal, and
   the first voltage terminal is a power source voltage terminal, and the second voltage terminal is a ground voltage terminal.

5. The impedance adjusting circuit of claim 1, wherein the resistor is coupled between the first node and a second voltage terminal, and
   the first voltage terminal is a ground voltage terminal, and the second voltage terminal is a power source voltage terminal.

6. The impedance adjusting circuit of claim 1, further comprising:
   a second impedance unit having an impedance value determined based on a second impedance code and coupled between a second voltage terminal and a third node;
   a second switching unit suitable for electrically connecting the first node and the third node to each other in response to the clock;
   a second comparison unit suitable for comparing the average voltage of the first node with a second reference voltage to produce a comparison result of the second comparison unit; and
   a second code generation unit suitable for generating the second impedance code in response to the comparison result of the second comparison unit.

7. The impedance adjusting circuit of claim 6, wherein the second switching unit and the second code generation unit are disabled in a section where the first impedance code is generated, and
   the first code generation unit is disabled in a section where the second impedance code is generated.

8. The impedance adjusting circuit of claim 6, wherein the second switching unit includes:
   a second boot strapper suitable for level-shifting the clock; and
   a second switch suitable for electrically connecting the first node and the third node to each other in response to the level-shifted clock obtained by the second boot strapper.

9. The impedance adjusting circuit of claim 1, further comprising:
   a second impedance unit having an impedance value determined based on the first impedance code and coupled between the first voltage terminal and a third node;
   a third impedance unit having an impedance value determined based on the second impedance code and coupled between the second voltage terminal and a fourth node;
   a second switching unit suitable for electrically connecting a fifth node and the third node to each other in response to the clock;
   a third switching unit suitable for electrically connecting the fifth node and the fourth node to each other in response to the clock;
   a second average voltage unit suitable for generating an average voltage of the fifth node;
   a second comparison unit suitable for comparing the average voltage of the fifth node with a second reference voltage to produce a comparison result of the second comparison unit; and
   a second code generation unit suitable for generating the second impedance code in response to the comparison result of the second comparison unit.

10. The impedance adjusting circuit of claim 9, wherein the second switching unit includes:
    a second boot strapper suitable for level-shifting the clock; and
    a second switch suitable for electrically connecting the fifth node and the third node to each other in response to the level-shifted clock obtained by the second boot strapper, and
    the third switching unit includes:
    a third boot strapper suitable for level-shifting the clock; and
    a third switch suitable for electrically connecting the fifth node and the fourth node to each other in response to the level-shifted clock obtained by the third boot strapper.

11. The impedance adjusting circuit of claim 9, wherein the second average voltage unit includes a second low pass filter.

12. An integrated circuit, comprising:
a first node coupled to a resistor;
a first impedance unit having an impedance value determined based on a first impedance code and coupled between a first voltage terminal and a second node;
a first switching unit suitable for electrically connecting the first node and the second node to each other in response to a clock;
a first average voltage unit suitable for generating an average voltage of the first node;
a first comparison unit suitable for comparing the average voltage of the first node with a first reference voltage to produce a comparison result of the first comparison unit;
a first code generation unit suitable for generating the first impedance code in response to the comparison result of the first comparison unit;
a second impedance unit having an impedance value determined based on a second impedance code and coupled between a second voltage terminal and a third node;
a second switching unit suitable for electrically connecting the first node and the third node to each other in response to the clock;
a second comparison unit suitable for comparing the average voltage of the first node with a second reference voltage to produce a comparison result of the second comparison unit;
a second code generation unit suitable for generating the second impedance code in response to the comparison result of the second comparison unit;
a first output driver circuit having a driving force controlled based on the first impedance code and the second impedance code to output first output data to a fourth node;
a second output driver circuit having a driving force controlled based on the first impedance code and the second impedance code to output second output data to a fifth node;
a third switching unit suitable for electrically connecting the fourth node and an output node to each other in response to the clock; and
a fourth switching unit suitable for electrically connecting the fifth node and the output node to each other in response to an inverted clock.

13. The integrated circuit of claim 12, wherein the second switching unit and the second code generation unit are disabled in a section where the first impedance code is generated, and
the first code generation unit is disabled in a section where the second impedance code is generated.

14. The integrated circuit of claim 12, wherein the first output driver circuit includes:
a first pull-up driver that drives the fourth node with a first logic level, when the first output data is in the first logic level, and has an impedance value controlled based on the first impedance code; and
a first pull-down driver that drives the fourth node with a second logic level, when the first output data is in the second logic level, and has an impedance value controlled based on the second impedance code.

15. The integrated circuit of claim 14, wherein the second output driver circuit includes:
a second pull-up driver that drives the fifth node with the first logic level, when the second output data is in the first logic level, and has an impedance value controlled based on the first impedance code; and
a second pull-down driver that drives the fifth node with the second logic level, when the second output data is in the second logic level, and has an impedance value controlled based on the second impedance code.

16. An integrated circuit, comprising:
a first node coupled to a resistor;
a first impedance unit having an impedance value determined based on a first impedance code and coupled between a first voltage terminal and a second node;
a first switching unit suitable for electrically connecting the first node and the second node to each other in response to a clock;
a first average voltage unit suitable for generating an average voltage of the first node;
a first comparison unit suitable for comparing the average voltage of the first node with a first reference voltage to produce a comparison result of the first comparison unit;
a first code generation unit suitable for generating the first impedance code in response to the comparison result of the first comparison unit;
a second impedance unit having an impedance value determined based on the first impedance code and coupled between the first voltage terminal and a third node;
a third impedance unit having an impedance value determined based on a second impedance code and coupled between a second voltage terminal and a fourth node;
a second switching unit suitable for electrically connecting a fifth node and the third node to each other in response to the clock;
a third switching unit suitable for electrically connecting the fifth node and the fourth node to each other in response to the clock;
a second average voltage unit suitable for generating an average voltage of the fifth node;
a second comparison unit suitable for comparing the average voltage of the fifth node with a second reference voltage to produce a comparison result of the second comparison unit;
a second code generation unit suitable for generating the second impedance code in response to the comparison result of the second comparison unit;
a first output driver circuit having a driving force controlled based on the first impedance code and the second impedance code to output first output data to the fourth node;
a second output driver circuit having a driving force controlled based on the first impedance code and the second impedance code to output second output data to the fifth node;
a fourth switching unit suitable for electrically connecting the fourth node and an output node to each other in response to the clock; and
a fifth switching unit suitable for electrically connecting the fifth node and the output node to each other in response to an inverted dock.

17. The integrated circuit of claim 16, wherein the first output driver circuit includes:
a first pull-up driver that drives the fourth node with a first logic level, when the first output data is in the first logic level, and has an impedance value controlled based on the first impedance code; and
a first pull-down driver that drives the fourth node with a second logic level, when the first output data is in the second logic level, and has an impedance value controlled based on the second impedance code.

18. The integrated circuit of claim 16, wherein the second output driver circuit includes:
- a second pull-up driver that drives the fifth node with the first logic level, when the second output data is in the first logic level, and has an impedance value controlled based on the first impedance code; and
- a second pull-down driver that drives the fifth node with the second logic level, when the second output data is in the second logic level, and has an impedance value controlled based on the second impedance code.

* * * * *